United States Patent
Tishbi et al.

(10) Patent No.: US 12,148,496 B2
(45) Date of Patent: Nov. 19, 2024

(54) READOUT FROM MEMORY CELLS SUBJECTED TO PERTURBATIONS IN THRESHOLD VOLTAGE DISTRIBUTIONS

(71) Applicant: Apple Inc., Cupertino, CA (US)

(72) Inventors: Nir Tishbi, Kfar Saba (IL); Roy Roth, Tel Aviv (IL); Yonathan Tate, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 92 days.

(21) Appl. No.: 17/852,647

(22) Filed: Jun. 29, 2022

(65) Prior Publication Data

US 2024/0006014 A1    Jan. 4, 2024

(51) Int. Cl.
  *G11C 29/50*  (2006.01)
  *G11C 7/10*   (2006.01)

(52) U.S. Cl.
  CPC ...... *G11C 29/50004* (2013.01); *G11C 7/1069* (2013.01); *G11C 2029/5004* (2013.01)

(58) Field of Classification Search
  CPC ............ G11C 29/50004; G11C 7/1069; G11C 2029/5004
  USPC ....................................................... 714/721
  See application file for complete search history.

(56) References Cited

U.S. PATENT DOCUMENTS

| | | | |
|---|---|---|---|
| 8,289,781 B2 | 10/2012 | Litsyn et al. | |
| 8,369,141 B2 | 2/2013 | Sommer et al. | |
| 8,775,913 B2 | 7/2014 | Haratsch et al. | |
| 9,489,257 B2 | 11/2016 | Ish-Shalom et al. | |
| 9,741,402 B2 | 8/2017 | Jeon | |
| 10,347,343 B2 | 7/2019 | Sankaranarayanan et al. | |
| 10,884,855 B1 | 1/2021 | Yazovitsky et al. | |
| 11,322,214 B1* | 5/2022 | Zhang | G11C 16/30 |
| 2015/0006976 A1* | 1/2015 | Jeon | G11C 29/021 714/54 |
| 2017/0140802 A1* | 5/2017 | Jeon | G11C 7/14 |
| 2018/0159560 A1* | 6/2018 | Sharon | H03M 13/2906 |
| 2022/0100413 A1* | 3/2022 | Kim | G06F 3/0604 |

OTHER PUBLICATIONS

Tate et al., U.S. Appl. No. 17/388,048, filed Jul. 29, 2021.
Tate et al., U.S. Appl. No. 17/399,081, filed Aug. 11, 2021.

* cited by examiner

*Primary Examiner* — James C Kerveros
(74) *Attorney, Agent, or Firm* — MEITAR PATENTS LTD.

(57) ABSTRACT

A memory controller includes an interface and a processor. The interface is configured to communicate with a plurality of memory cells. The processor is configured to, using multiple Read Thresholds (RTs) positioned between adjacent Programming Voltages (PVs), produce (i) a base parametric model of Threshold Voltage Distributions (TVDs) associated with the PVs, and (ii) auxiliary information that depends on the RTs and on the base parametric model, to read a group of the memory cells using the RTs to produce multiple readouts, the threshold voltages of the memory cells in the group are distributed in accordance with actual TVDs, to derive from the base parametric model an actual parametric model, based on the multiple readouts and on the auxiliary information, and determine a readout parameter based on the actual parametric model, and to perform a read-related operation using the readout parameter.

20 Claims, 4 Drawing Sheets

READOUT FROM MEMORY CELLS SUBJECTED TO PERTURBATIONS IN THRESHOLD VOLTAGE DISTRIBUTIONS

TECHNICAL FIELD

Embodiments described herein relate generally to data storage, and particularly to methods and systems for reading memory cells based on parametric models of threshold voltage distributions.

BACKGROUND

In various types of nonvolatile memories, data is stored in multiple predefined programming levels. Reading data from the memory typically involves setting read thresholds between pairs of nominal programming levels. The data is typically stored encoded using an Error Correction Code (ECC) and subjected to ECC decoding when read. The data may be decoded using soft reliability measures of respective storage values representing the data.

Methods for determining read thresholds and soft reliability measures are known in the art. For example, U.S. Pat. No. 8,289,781 describes a plurality of flash memory cells that each is programmed to a respective one of L≥2 threshold voltage states within a threshold voltage window. Values of parameters of threshold voltage functions are adjusted in accordance with comparisons of the threshold voltages of some or all of the cells to two or more of m≥2 threshold voltage intervals within the threshold voltage window. Reference voltages for reading the cells are selected based on the values. Alternatively, the m threshold voltage intervals span the threshold voltage window, and respective threshold voltage states are assigned to the cells based on numbers of cells whose threshold voltages are in the intervals, without re-reading the cells.

U.S. Pat. No. 9,489,257 describes a method for data storage that includes reading storage values, which represent stored data, from a group of memory cells using read thresholds, and deriving respective soft reliability metrics for the storage values. The storage values are classified into two or more subgroups based on a predefined classification criterion. Independently within each subgroup, a subgroup-specific distribution of the storage values in the subgroup is estimated, and the soft reliability metrics of the storage values in the subgroup are corrected based on the subgroup-specific distribution. The stored data is decoded using the corrected soft reliability metrics.

SUMMARY

An embodiment that is described herein provides a memory controller that includes an interface and a processor. The interface is configured to communicate with a plurality of memory cells. The processor is configured to, using multiple Read Thresholds (RTs) positioned between adjacent Programming Voltages (PVs), produce (i) a base parametric model of Threshold Voltage Distributions (TVDs) associated with the PVs, and (ii) auxiliary information that depends on the RTs and on the base parametric model, to read a group of the memory cells using the RTs to produce multiple readouts, the threshold voltages of the memory cells in the group are distributed in accordance with actual TVDs, to derive from the base parametric model an actual parametric model, based on the multiple readouts and on the auxiliary information, and determine a readout parameter based on the actual parametric model, and to perform a read-related operation using the readout parameter.

In some embodiments, the readout parameter includes a Read Voltage (RV), and the processor is configured to determine an updated RV value for another group of the memory cells based on the actual parametric model, and to read a code word from the other group of the memory cells using the updated RV value. In other embodiments, the readout parameter includes confidence levels assigned respectively to bits of code words, and the processor is configured to assign confidence levels to bits of a given code word read from the group of the memory cells or from another group of the memory cells, based on the actual parametric model, and to apply soft decoding to the given code word using the assigned confidence levels. In yet other embodiments, the base parametric model and the actual parametric model include multiple parameters, and the processor is configured to derive the actual parametric model by estimating respective deviations between values of the parameters in the actual parametric model and in the base parametric model.

In an embodiment, the base parametric model models Gaussian TVDs, the actual parametric model models actual Gaussian TVDs, and the processor is configured to calculate the parameters by calculating mean values and standard-deviation values of the Gaussian TVDs and of the actual Gaussian TVDs. In another embodiment, the processor is configured to calculate, based on the multiple readouts, normalized cell-counts of memory cells in the group whose threshold voltages fall in respective zones defined by the RTs, and to estimate the deviations based on the normalized cell-counts and on the auxiliary information. In yet another embodiment, the auxiliary information includes an auxiliary vector and an auxiliary matrix, and the processor is configured to estimate the deviations by (i) calculating a difference vector between the normalized cell-counts and respective elements in the auxiliary vector, and (ii) multiplying between the auxiliary matrix and the difference vector.

In some embodiments, the processor is configured to produce based on the auxiliary matrix, a sequence of updated auxiliary matrices over multiple iterations, and to estimate the deviations using an updated auxiliary matrix. In other embodiments, the processor is configured to evaluate a criterion for updating the base parametric model, and to produce an updated base parametric model in response to meeting the criterion. In yet other embodiments, the processor is configured to read one or more other groups of the memory cells using the actual parametric model. In another embodiment, the processor is configured to hold separate base confidence levels for multiple respective subsets of the memory cells in the group, the subsets correspond to different threshold voltages of neighbor memory cells, to derive from the base confidence levels of the subsets corrected confidence levels, based on one or more actual parametric models, and to perform soft decoding to a given code word read from the group of the memory cells using the corrected confidence levels. In yet another embodiment, the processor is configured to calculate for the subsets separate respective actual parametric models, and to derive the corrected confidence levels in a given subset based on the actual parametric model associated with the given subset.

There is additionally provided, in accordance with an embodiment that is described herein, a method for data storage, including, in a memory controller that communicates with a plurality of memory cells, producing, using multiple Read Thresholds (RTs) positioned between adjacent Programming Voltages (PVs) (i) a base parametric model of Threshold Voltage Distributions (TVDs) associated with the PVs, and (ii) auxiliary information that depends on the RTs and on the base parametric model. A group of the memory cells is read using the RTs to produce multiple readouts, the threshold voltages of the memory cells in the group are distributed in accordance with actual TVDs. An actual parametric model is derived from the base parametric model, based on the multiple readouts and on the auxiliary information, and a readout parameter is determined based on the actual parametric model. A read-related operation is performed using the readout parameter.

These and other embodiments will be more fully understood from the following detailed description of the embodiments thereof, taken together with the drawings in which:

DETAILED DESCRIPTION OF EMBODIMENTS

Overview

Figure 1:
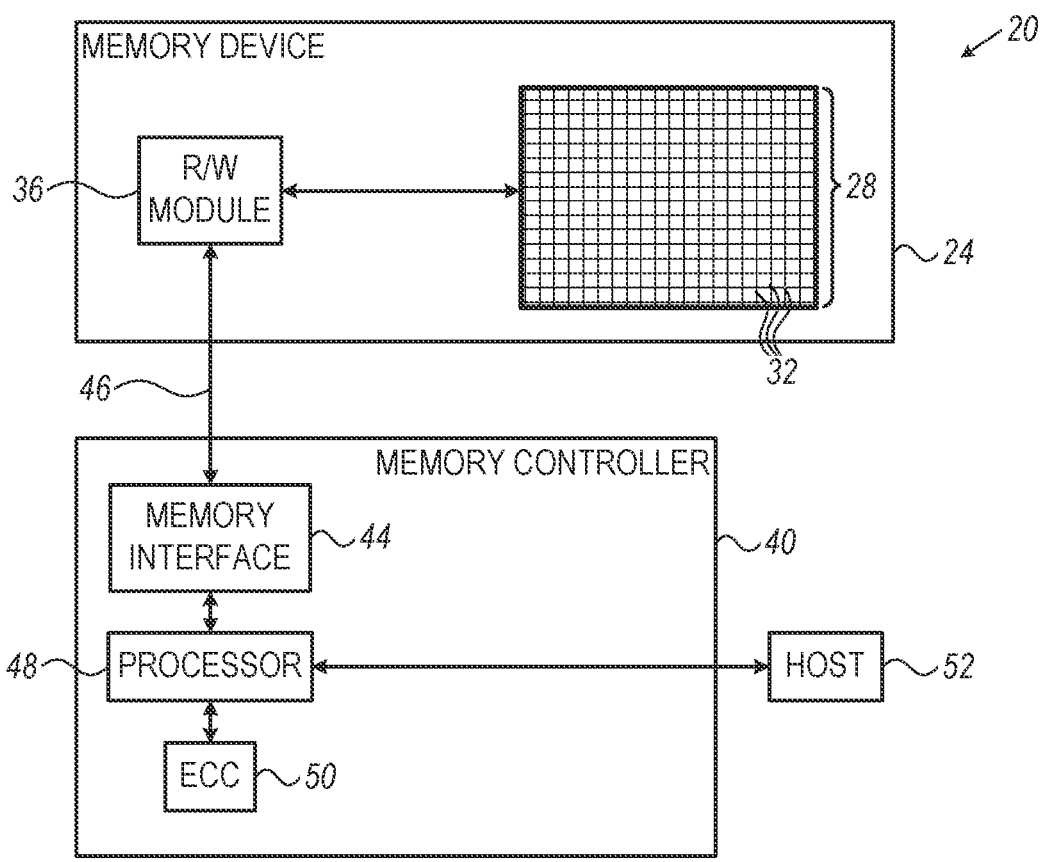
FIG. 1 is a block diagram that schematically illustrates a storage system, in accordance with an embodiment that is described herein.

Embodiments that are described herein provide methods and systems for reliable readout of memory cells whose Threshold Voltage Distributions (TVDs) may vary across Word Lines (WLs). In the disclosed embodiments TVDs are modeled using parametric models. Upon reading a group of the memory cells, an actual parametric model is derived from a previously determined base parametric model, for accurate modeling of actual TVDs of the memory cells being read.

In various storage devices, statistical properties of threshold voltages of memory cells may differ among different WLs (or even among different groups of memory cells within a WL). Consequently, a readout parameter that has been optimized for reading from one WL would typically be suboptimal for reading from other WLs. Readout parameters that may affect readout reliability include, for example, Read Voltages (RVs), and confidence levels that are assigned to bits of code words, such as Log Likelihood Ratios (LLRs).

LLRs are typically pre-calculated in certain confidence intervals positioned relative to an optimal RV (or another reference point). Reading the memory cells using a suboptimal RV may result in mispositioned confidence intervals, which may cause a mismatch between the pre-calculated LLRs and the optimal LLRs for the memory cells being read. Such a mismatch may also occur due to variations in the TVDs across WLs. The inventors discovered through computer simulations on real data collected from NAND devices, that even small variations in TVDs across WLs may cause considerable degradation in readout reliability.

In principle, to eliminate the effect of TVDs perturbations, a naïve approach could be used, in which optimal RVs and/or LLRs are calculated for each WL (or code word). This approach, however, is computationally complex, and would result in considerable degradation in readout throughput.

In the disclosed embodiments, a low-complexity reliable readout approach is adopted. In this novel approach, a base parametric model of the TVDs is first determined. To compensate for offsets in RV positions and for variations in the TVDs, an actual parametric model is derived from the base parametric model upon reading. Moreover, readout parameters such as RVs and LLRs are calculated close to their optimal values based on the actual parametric model. The disclosed readout approach is much more computationally efficient than the naïve approach mentioned above.

Consider an embodiment of a memory controller that includes an interface and a processor. The interface communicates with a plurality of memory cells. Using multiple Read Thresholds (RTs) positioned between adjacent Programming Voltages (PVs), the processor produces (i) a base parametric model of Threshold Voltage Distributions (TVDs) associated with the PVs, and (ii) auxiliary information that depends on the RTs and on the base parametric model. The processor further reads a group of the memory cells using the RTs to produce multiple readouts, wherein threshold voltages of the memory cells in the group are distributed in accordance with actual TVDs, derives from the base parametric model an actual parametric model, based on the multiple readouts and on the auxiliary information, and determines a readout parameter based on the actual parametric model. The processor performs a read-related operation using the readout parameter.

In some embodiments, the readout parameter includes a Read Voltage (RV), in which case the processor determines an updated RV value for another group of the memory cells based on the actual parametric model and reads a code word from this group of the memory cells using the updated RV value. In other embodiments, the readout parameter includes confidence levels assigned respectively to bits of code words. In these embodiments, the processor assigns confidence levels to bits of a given code word read from the group of the memory cells or from another group of the memory cells, based on the actual parametric model, and applies soft decoding to the given code word using the assigned confidence levels.

Each of the base parametric model and the actual parametric model includes multiple parameters specifying the underlying TVDs. The processor derives the actual parametric model by estimating respective deviations between values of the parameters in the actual parametric model and in the base parametric model. The processor may use any suitable parametric model for the TVDs. For example, the processor may model TVDs using Gaussian models having a mean value parameter and a standard-deviation (STD) parameter.

In some embodiments, the processor calculates, based on the readouts, normalized cell-counts of memory cells in the group whose threshold voltages fall in respective zones defined by the RTs. The processor estimates the deviations based on the normalized cell-counts and on the auxiliary information.

In an example embodiment, the auxiliary information includes an auxiliary vector and an auxiliary matrix. In this embodiment, the processor estimates the deviations by (i) calculating a difference vector between the normalized cell-counts and respective elements in the auxiliary vector, and (ii) multiplying between the auxiliary matrix and the difference vector.

The base parametric model may be valid for deriving actual parametric models for a limited number of WLs, e.g., within a memory block, after which the base parametric model itself needs to be re-calculated. In an embodiment, the processor evaluates a criterion for deciding on updating the base parametric model and produces an updated base parametric model in response to meeting the criterion. The criterion may include, for example, meeting a predefined number of read operations since the previous update of the base parametric model, exceeding a predefined decoding failure rate, and the like.

When deviations from the base parametric model are large, the auxiliary matrix may be updated iteratively as part of a single read operation. In this embodiment, the processor produces, based on the auxiliary matrix, a sequence of updated auxiliary matrices over multiple iterations, and estimates the deviations using an updated auxiliary matrix. When the deviations from the base parametric model are small, the processor may read one or more groups of the memory cells using the same actual parametric model.

In some embodiments, the memory controller holds separate base confidence levels for multiple respective subsets of the memory cells in the group, the subsets correspond to different threshold voltages of neighbor memory cells. The memory controller derives from the base confidence levels of the subsets corrected confidence levels, based on one or more actual parametric models, and performs soft decoding to a given code word read from the group of the memory cells using the corrected confidence levels. In an embodiment, the memory controller calculates for the subsets separate respective actual parametric models and derives the corrected confidence levels in a given subset based on the actual parametric model associated with the given subset.

In the disclosed techniques, a base parametric model and related auxiliary information are first determined. For memory cells associated with actual TVDs, an actual parametric model is efficiently derived from the base parametric model using the auxiliary information. Using the disclosed embodiments, readout parameters such as RVs and LLRs can be determined efficiently with high accuracy, resulting in high readout reliability with minimal impact on readout throughput.

System Description

FIG. 1 FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32. In the context of the present patent application, the term "memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as storage values or threshold voltages. Although the embodiments described herein mainly address threshold voltages, the methods and systems described herein may be used with any other suitable kind of storage values.

Memory system 20 stores data in memory cells 32 by programming the memory cells to assume respective memory states, which are also referred to as programming levels or programming voltages. The programming levels are selected from a finite set of possible levels, and each programming level corresponds to a certain nominal storage value, also referred to as a nominal Programming Voltage (PV). For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), and a 4 bit/cell MLC, also referred to as a Quad-Level Cell (QLC) device can be respectively programmed to assume one of eight possible programming levels and one of sixteen programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the storage values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may include any suitable type of ECC, such as, for example, Low Density Parity Check (LDPC), Reed-Solomon (RS) or Bose-Chaudhuri-Hocquenghem (BCH), can be used. In some embodiments, the ECC supported by ECC module 50 can be represented by a set of parity-check equations such as, for example, LDPC codes.

Data read from a group of memory cells may contain one or more errors. The number of errors typically increases when the read threshold used for sensing the memory cells is positioned non-optimally.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (RAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subgroup of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

Reliable Readout Using Parametric Models of Threshold Voltage Distributions

The description that follows refers mainly to a parametric model that models two adjacent TVDs and a related RV positioned between these TVDs. In general, however, multiple independent parametric models of this sort can be handled for multiple pairs of adjacent TVDs and related RVs, in an embodiment.

Data pages having different respective bit significance values are also referred to herein as page types. In some of the disclosed embodiments, in modeling TVDs of a RV of a certain page type, the memory controller separates memory cells or bits related to this RV from those of other RVs used in reading the page type, e.g., using one or more readouts of other page types read from the same group of the memory cells.

Figure 2:
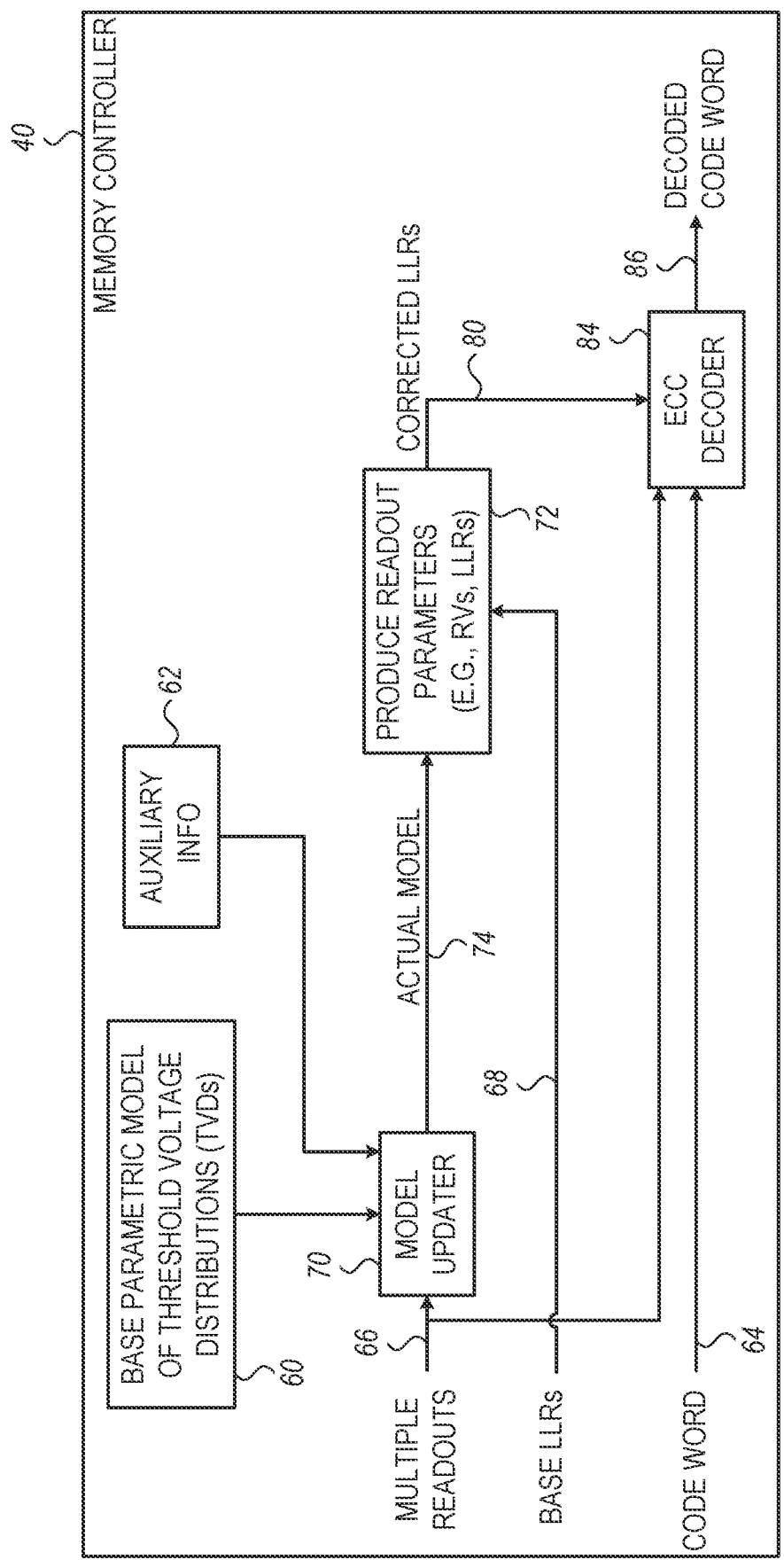
FIG. 2 is a block diagram that schematically illustrates readout processing using parametric models of Threshold Voltage Distributions (TVDs), in accordance with an embodiment that is described herein.

FIG. 2 is a block diagram that schematically illustrates readout processing using parametric models of Threshold Voltage distributions (TVDs), in accordance with an embodiment that is described herein. The readout processing will be described as executed by memory controller 40.

In describing the readout processing in FIG. 2, it is assumed that before invoking the readout, the memory controller has retrieved from a group of memory cells a code word 64 using a RV that may differ from the optimal RV for these memory cells. The memory controller has additionally read the memory cells in the group using multiple RTs positioned about the RV, to produce multiple readouts 66, and based on zones defined by these RTs has calculated base confidence levels 68 in these zones. In some embodiments, readouts 66 include one or more separator readouts (of other page types) that are used for separating among memory cells or bits related to different RVs.

Although in the present example confidence levels 68 comprise LLRs, in alternative embodiments, other suitable types of confidence levels can also be used. Base confidence levels 68 are typically suboptimal for the present readout.

In the embodiment of FIG. 2, memory controller 40 comprises a model updater 70, a readout-parameter producer 72, and an ECC decoder 84. Based on readouts 66 and auxiliary information 62, model updater 70 derives from a base parametric model 60 an actual parametric model 74. Readout-parameter producer 72 uses the actual parametric model for determining the values of one or more readout parameters, e.g., RVs and/or LLRs.

The functionality of readout-parameter producer 72 may be implemented using any suitable methods. Methods for positioning RVs based on Gaussian models are described, for example, in U.S. patent application Ser. No. 17/388,048. Methods for determining confidence levels based on Gaussian models are described, for example, in U.S. Pat. No. 9,489,257 mentioned above. Other methods for determining confidence levels will be described in detail further below, with reference to FIG. 4.

In the present example, readout-parameter producer 72 uses the actual parametric model for producing from base confidence levels 68, for example from base LLRs, corrected LLRs 80, which are typically closer to optimal LLRs compared to the base LLRs. ECC decoder 84 (e.g., within ECC module 50) assigns corrected LLRs 80 to the bits of code word 64, by associating the bits with respective zones using readouts 66. ECC decoder then applies soft decoding to code word 64 using corrected LLRs 80, resulting in a decoded code word 86. By using corrected LLRs 80, the probability of successful decoding improves significantly compared to using the base LLRs.

In some embodiments, the threshold voltages of memory cells in a given WL may be affected by the threshold voltages of neighbor memory cells belonging, e.g., to adjacent WLs. Due to the cross talk among neighboring memory cells, the TVDs of the memory cells may be affected, which may degrade decoding performance. In some embodiments, to mitigate cross talk, the memory controller divides the memory cells in the given WL into multiple subsets of the memory cells, the subsets corresponding to respective different threshold voltages of the neighbor memory cells. For identifying the multiple subsets, the memory controller may retrieve additional readouts from the neighbor WLs.

In some embodiments, the memory controller holds separate base LLRs for the different subsets and derives from the base LLRs in each of the subsets corrected LLRs, based on one or more actual parametric models. The memory controller performs soft decoding to a given code word read from the group of the memory cells using the corrected LLRs. In one embodiment, the memory controller derives the corrected LLRs in multiple subsets using a common actual parametric model. In another embodiment, the memory controller calculates separate respective actual parametric models for the subsets, and derives corrected LLRs in the subsets based on the respective actual parametric models. The memory controller may derive the multiple actual models from a common base parametric model or from multiple base parametric models associated with the subsets.

Deriving an Actual Parametric Model from a Base Parametric Model

Figure 3:
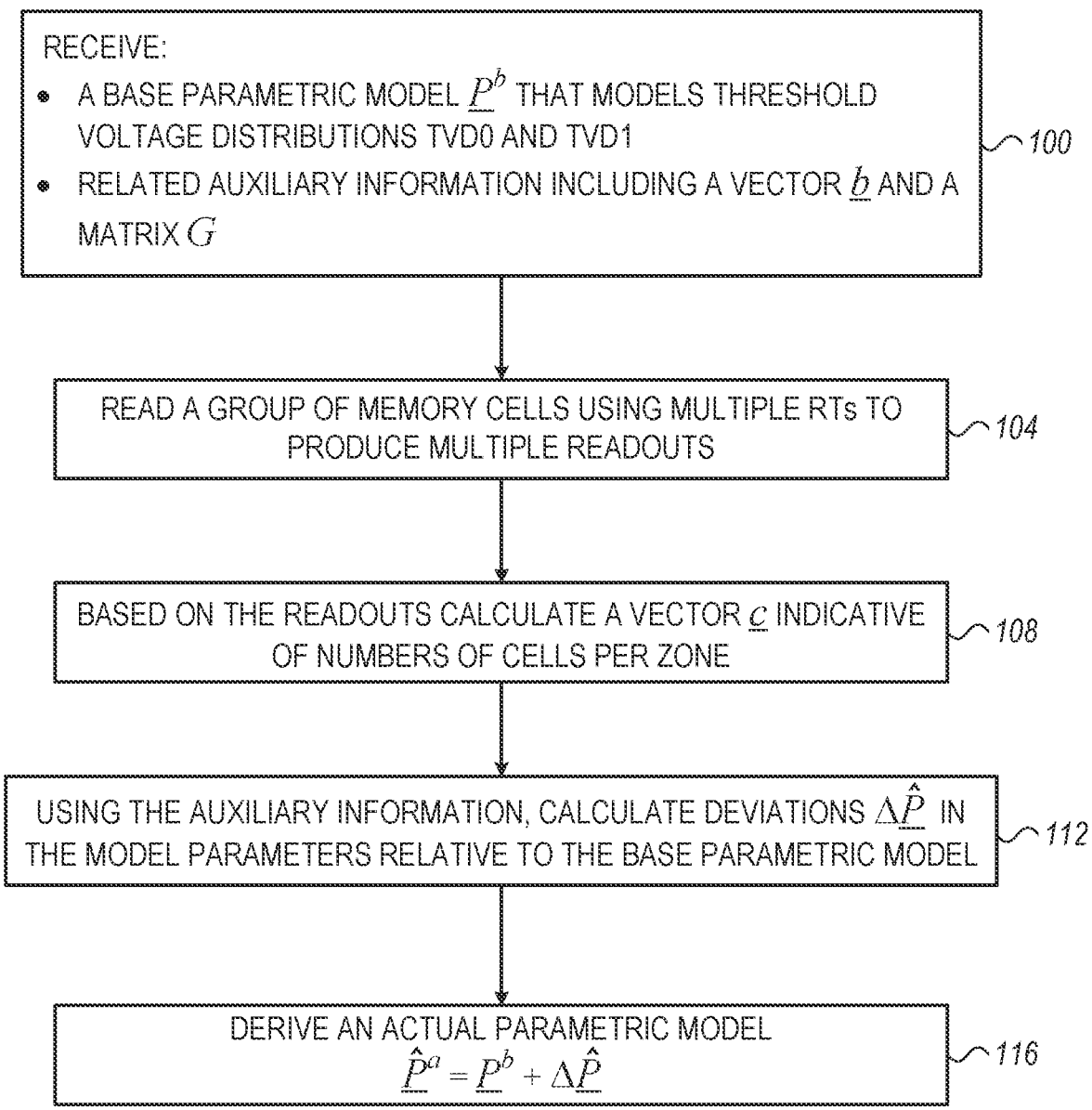
FIG. 3 is a flow chart that schematically illustrates a method for deriving an actual parametric model from a base parametric model using predetermined auxiliary information, in accordance with an embodiment that is described herein.

FIG. 3 is a flow chart that schematically illustrates a method for deriving an actual parametric model from a base parametric model using predetermined auxiliary information, in accordance with an embodiment that is described herein. The method will be described as executed by model updater 70 of FIG. 2.

The method of FIG. 3 refers mainly to base and parametric models related to a single RV. The method can be executed, however, multiple times for handling parametric models related to multiple different RVs, in an embodiment.

The method begins with model updater 70 receiving a base parametric model $\underline{P}^b$ (60) and related auxiliary information (62), at an input step 100. In some embodiments base parametric model 60 may be determined (e.g., by the memory controller) using any suitable method, e.g., using methods for estimating Gaussian models as described in U.S. patent application Ser. No. 17/388,048 mentioned above. In some embodiments, auxiliary information 62 may be derived (e.g., by the memory controller) using any suitable method, e.g., as described in Appendix-1 further below.

In the present example, the base parametric model is associated with adjacent Gaussian TVDs denoted TVD0 and TVD1. Although the present example refers mainly to base and actual parametric models corresponding to a pair of adjacent TVDs, in alternative embodiments, the memory controller may handle multiple parametric models associated with multiple pairs of TVDs.

The base parametric model includes parameters of the underlying TVDs, e.g., statistical parameters such as mean values (denoted by the symbols $\mu$) and standard-deviation (STD) vales (denoted by the symbol $\sigma$) of the underlying Gaussian TVDs as given by:

$$\underline{P}^b = [\mu_0^b, \mu_1^b, \sigma_0^b, \sigma_1^b]^T \qquad \text{Equation 1:}$$

Auxiliary information 62 depends on the base parametric model and on the RTs used in determining the base parametric model. Assuming a number "L" of RTs, the auxiliary information comprises an L-by-1 vector $\underline{b}$ and a 4-by-L matrix G. Relationships between the auxiliary information and the base parametric model are described in Appendix-1 further below.

At a readout step 104, model updater 70 reads a group of memory cells using the L RTs to produce L respective readouts (66). The L RTs define (L−1) confidence intervals of the threshold voltages, also referred to herein as "zones." Distributions TVD0 and TVD1 associated with the memory cells being read typically differ from corresponding TVDs associated the base parametric model. An actual parametric model denoted $\underline{P}^a$ corresponding to the TVDs of the memory cells being read is given by:

$$\underline{P}^a = [\mu_0^a, \mu_1^a, \sigma_0^a, \sigma_1^a]^T \qquad \text{Equation 2:}$$

At a counting step 108, the model updater produces an (L−1)-by-1 vector $\underline{c}$ that is indicative of respective normalized numbers of memory cells whose threshold voltages fall within respective (L−1) zones. The model updater may calculate the vector $\underline{c}$ using Equation 9 in Appendix-1, for example, or using any other suitable method.

Deviation from the base parametric model (denoted $\Delta\underline{P}$) is specified by a 4-by-1 deviation vector specifying deviations in respective parameters between the base and actual parametric model, as given by:

$$\Delta\underline{P} = [\Delta\mu_0, \Delta\mu_1, \Delta\sigma_0, \Delta\sigma_1]^T \qquad \text{Equation 3:}$$

wherein, $\Delta\mu_i = \mu_i^a - \mu_i^b$ and $\Delta\sigma_i = \sigma_i^a - \sigma_i^b$ (for i=0, 1).

At a deviation estimation step 112, the model updater estimates $\Delta\underline{P}$ as given by:

$$\Delta\hat{\underline{P}} = G \cdot (\underline{c} - \underline{b}) \qquad \text{Equation 4:}$$

wherein $\underline{b}$ and G respectively denote the auxiliary vector and auxiliary matrix of auxiliary information 62 related to the base parametric model $\underline{P}^b$ of step 100.

At a model updating step 116, the model updater derives the actual parametric model $\underline{\hat{P}}^a$ as given by:

$$\underline{\hat{P}}^a = \underline{P}^b + \Delta\underline{\hat{P}} \qquad \text{Equation 5:}$$

Following step 116, the model updater outputs the actual parametric model $\underline{\hat{P}}^a$ and the method terminates.

Relationship between the base and actual parametric models (as formulated via auxiliary matrix G in Appendix-1 below) are essentially valid for small TVD perturbations about the nominal TVDs of the base parametric model. As such, for large deviations in the parameters relative to the base parametric model, the calculation of auxiliary matrix G using Equation 17 or 18 may be inaccurate, which in turn degrades accuracy in calculating deviation vector $\Delta\underline{P}$ using Equation 4 above.

In some embodiments, the deviation vector is calculated via iterative re-calculation of Equation 4, wherein in each iteration the model updater uses approximate parameter values from the previous iteration to update the auxiliary matrix G (e.g., using Equation 17 or 18). The model updater may invoke such an iterative calculation, for example, when decoding of the code word fails.

Example embodiments aiming for reducing the computational burden in deriving actual parametric models are described herein.

In some embodiments, variations in TVDs across code words (or across WLs) are relatively small (but still cause degradation in readout reliability). In such embodiments, the memory controller may derive an actual parametric model for a group of memory cells (e.g., as described in FIG. 3) and then read one or more other groups of the memory cells using this same actual parametric model.

Depending on TVD variations observed across code words or across WLs, base and actual parametric models that include a partial subset of the entire parameters may be used, thereby reducing computational complexity. For example, TVDs may differ across WLs mainly in mean values, while the STD values remain essentially unchanged. In this case, base and actual parametric models that include mean values but not STD values may be used. Such embodiments result in reduced computational complexity and in improved accuracy in estimating the mean values. In another embodiment, the parameter space may be reduced to a single parameter, e.g., when same shifts in the mean values are expected in both TVD0 and TVD1.

Another embodiment with reduced computational complexity and reduced latency may be applicable when variations in the TVDs are dominant across strings/WLs but are much smaller across code words within the same data page. In this embodiment, the memory controller calculates an actual parametric model for one code word in the data page and uses this actual parametric model for reading multiple code words in the data page.

In some embodiments, TVDs are highly correlated across code words within the same data page. In such embodiments, estimation accuracy can be improved by the memory controller carrying out the method of FIG. 3 based on the entire data page rather than based on a single code word. Alternatively, the memory controller estimates multiple individual deviation vectors for multiple respective code words of a data page and calculates for the data page an average deviation vector, based on the individual deviation vectors.

Correction of Confidence Levels Using a Parametric Model of Tvds

As noted above, for improved decoding capabilities, code words are assigned confidence levels such as LLRs, which are associated with respective zones. For optimal decoding performance, the memory controller is required to calculate optimal LLRs that reflect true statistical properties of the numbers of memory cells whose threshold voltages fall within each of the zones.

In some embodiments, LLRs are pre-calculated using RTs positioned about a reference point, e.g., about the optimal RV. Computer simulations on data collected from NAND devices indicate that significant degradation in decoding performance may occur when the pre-calculated LLRs are applied in zones that are mispositioned (i) relative to the zones used in determining the optimal LLRs, and/or (ii) due to variations in the TVDs.

In some disclosed embodiments, to compensate for misposition of the zones, the memory controller translates the pre-calculated LLRs into actual LLRs, based on an actual parametric model of the TVDs. The memory controller applies soft decoding to a code word using the actual LLRs.

Although the embodiments described refer mainly to LLRs in zones related to a single RV, in other embodiments, the memory controller may handle multiple sets of LLRs corresponding to different respective RVs. Moreover, for each RV, corrected LLRs are derived from base LLRs using a corresponding actual parametric model, in an embodiment.

Figure 4:
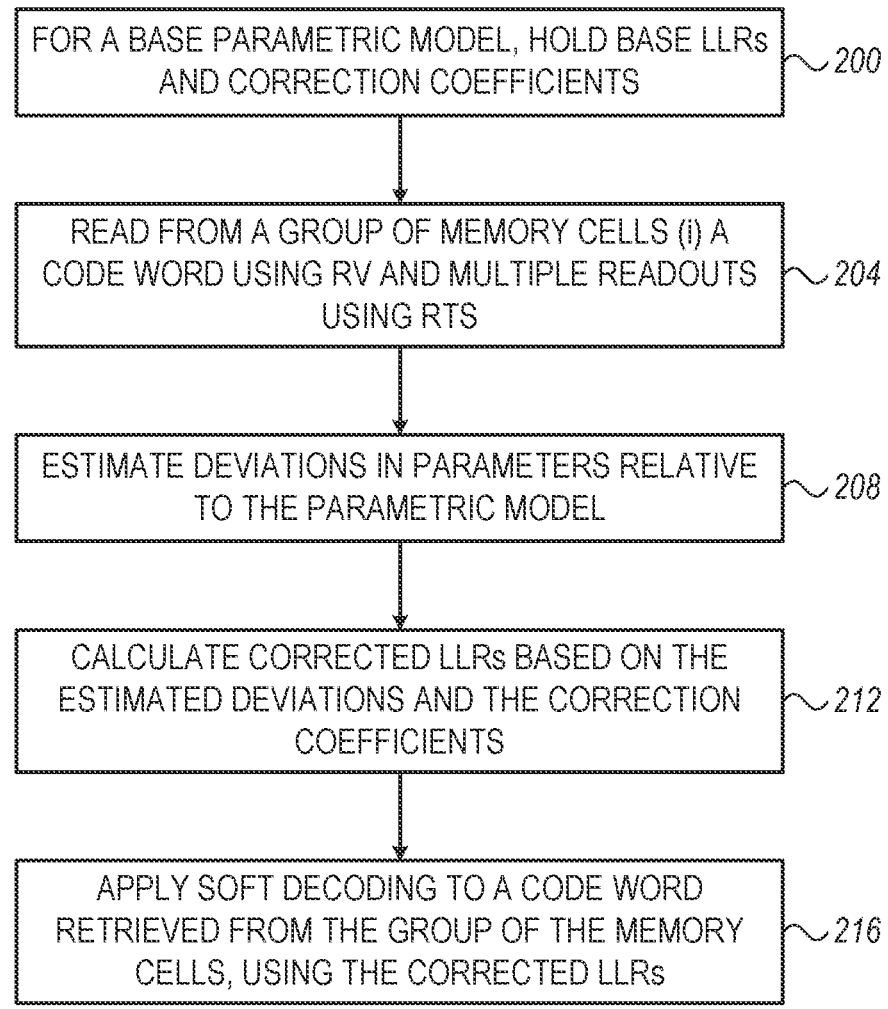
FIG. 4 is a flow chart that schematically illustrates a method for calculating corrected confidence levels based on a parametric model of underlying TVDs, in accordance with an embodiment that is described herein.

FIG. 4 is a flow chart that schematically illustrates a method for calculating corrected confidence levels based on a parametric model of the underlying TVDs, in accordance with an embodiment that is described herein.

The method may be used in implementing readout-parameter producer 72 of FIG. 2 above. The method will be described as executed by processor 48 of memory controller 40.

The method of FIG. 4 begins at an initialization step 200, with processor 48 holding for a base parametric model, (L+1) base confidence levels denoted $LLR_k$, and $2 \cdot (L+1)$ corresponding correction coefficients denoted $COEF_{k,0}$ and $COEF_{k,1}$. The base parametric model is associated with related auxiliary information, as described above. In an example embodiment, the processor calculates the correction coefficients using Equations 22 and 23 in Appendix-2, wherein the functions f(•) in Equation 23 denote distribution functions corresponding to Gaussian distributions TVD0 and TVD1 in the base parametric model.

At a readout step 204, the processor reads from a group of memory cells (i) a code word using a given RV, and (ii) multiple readouts using L respective RTs positioned about the given RV. The zones defined by the RTs may be mispositioned, e.g., due to deviations between actual TVDs and the TVDs used in determining the base parametric model.

At a deviation estimation step 208, the processor estimates deviations in parameters between the actual parametric model and the base parametric model, as described above. In the present example, the processor estimates deviations $\Delta\mu_0$ and $\Delta\mu_1$ in the mean values, based on the auxiliary information, using a calculation similar to that of Equation 4 above.

At an LLR correction step 212, the processor calculates corrected LLRs using the correction coefficients of step 200. For example, the processor calculates $\widetilde{LLR}_k = LLR_k + COEF_{k,0} \cdot \Delta\mu_0 + COEF_{k,1} \cdot \Delta\mu_1$, as given in Equation 21 of Appendix-2.

At a decoding step 216, the processor applies to the code word soft decoding (e.g., using ECC module 50) using the corrected LLRs. Following step 216 the method terminates.

Appendix-1: Derivation of Auxiliary Information Related to a Base Parametric Model This Appendix describes mathematical derivation of auxiliary information related to a base parametric model. The auxiliary information includes an auxiliary vector $\underline{b}$ and an auxiliary matrix G that may be used for estimating deviation vector $\Delta\hat{\underline{P}}$ in Equation 4 above.

Consider Gaussian models of distributions TVDi (i=0,1), having distribution functions given by:

$$f(v;\mu_i,\sigma_i) = \frac{1}{\sqrt{2\pi\sigma_i^2}}\exp\left(\frac{-(v-\mu_i)^2}{2\sigma_i^2}\right) \quad \text{Equation 6}$$

It can be shown that a Gaussian distribution $TVD_i^a \sim f(\mu_i^a, \sigma_i^a)$ can be approximated based on parameters of another Gaussian distribution $TVD_i^b \sim f(\mu_i^b, \sigma_i^b)$. In this formulation the parameters $\mu_i^b, \sigma_i^b$ are assumed to be known (e.g., serving as a base parametric model). The distribution function of $TVD_i^a$ can thus be approximated as given by:

$$f(\mu_i^a,\sigma_i^a) \approx f(\mu_i^b,\sigma_i^b) = f(\mu_i^b,\sigma_i^b) \cdot A_i \cdot \Delta\mu_i - f(\mu_i^b,\sigma_i^b) \cdot B_i \cdot \Delta\sigma_i \quad \text{Equation 7:}$$

wherein the deviations in parameters $\Delta\mu_i$ and $\Delta\sigma_i$ are given in Equation 3 above, and $A_i$ and $B_i$ are given by:

$$A_i = \frac{(v-\mu_i^b)}{(\sigma_i^b)^2}; \quad B_i = \frac{1-[(v-\mu_i^b)^2/(\sigma_i^b)^2]}{\sigma_i^b} \quad \text{Equation 8}$$

Let $\{v_k\}_{k=0}^{L-1}$ denote L sampling points (RTs) positioned between two adjacent programming voltages PV0 and PV1. The sampling points are separated by a common interval.

A readout taken from memory cells associated with Gaussian distributions $TVD_0^a$ and $TVD_1^a$ using the $k^{th}$ sampling point $v_k$, is denoted herein $\underline{d}(v_k)$. It is noted that $\underline{d}(v_k)$ comprises a readout retrieved from the memory cells and properly masked to isolate the bits related to the underlying RV used. The memory controller may generate the mask based on one or more separator readouts, e.g., readouts of one or more other page types taken at corresponding RVs. Normalized cell-counts in zones between adjacent sampling points can be calculated as given by:

$$c_k = \frac{1}{N}\underline{1}^T[\underline{d}(v_k) \oplus \underline{d}(v_{k+1})], \quad k=1 \ldots L-1 \quad \text{Equation 9}$$

wherein the symbol ⊕ denotes a bitwise XOR operation, and N denotes a nominal (e.g., average) number of memory cells programmed in each of PV0 and PV1.

In some embodiments, in performing the method of FIG. 3 above, memory controller 40 reads the memory cells multiple times using the sampling points $v_k$, and calculates a vector of L-1 normalized cell-counts $\underline{c}=[c_1 \ldots c_{L-1}]^T$ using Equation 9.

The $k^{th}$ normalized cell-count $c_k$ models the probability of threshold voltages of memory cells that are distributed in accordance with $TVD_0^a$ and $TVD_1^a$, fall in a zone $[v_{k-1}, v_k]$. This probability can be expressed as:

$$c_k = P_{k,0} + P_{k,1} + e_k \quad \text{Equation 10:}$$

wherein $e_k$ denotes a random variable whose distribution function depends on normalized-by-N binomial distributions $BIN(N,P_{k,i})$, and the probabilities $P_{k,i}$ (i=0,1) are given by:

$$P_{k,i} = \int_{v_{k-1}}^{v_k} f(v;\mu_i^a,\sigma_i^a)dv = \frac{1}{2}\left[Q\left(\frac{(v_{k-1}-\mu_i^a)}{\sigma_i^a}\right) - Q\left(\frac{(v_k-\mu_i^a)}{\sigma_i^a}\right)\right] \quad \text{Equation 11}$$

It can be shown that the vector $\underline{c}=[c_1 \ldots c_L]^T$ may be expressed as given by:

$$\underline{c} = H \cdot \Delta\underline{P} + \underline{b} + \underline{e} \quad \text{Equation 12:}$$

wherein $\underline{e}$ denotes an L-by-1 vector of $e_k$ values, and $\underline{b}$ denotes an L-by-1 vector whose $k^{th}$ element is given by:

$$b_k = f(v_{k-1};\mu_0^b,\sigma_0^b) + f(v_k;\mu_0^b,\sigma_0^b) + f(v_{k-1};\mu_1^b,\sigma_1^b) + f(v_k;\mu_1^b,\sigma_1^b) \quad \text{Equation 13:}$$

In Equation 12, the symbol H denotes an L-by-4 matrix organized as four L-by-1 vectors, $H=[\underline{h}_0, \underline{h}_1, \underline{h}_2, \underline{h}_3]$ wherein the $k^{th}$ elements of these vectors are given by:

$$\underline{h}_{k0} = \frac{1}{(\sigma_0^b)^2}[f(v_{k-1};\mu_0^b,\sigma_0^b)A_0(v_{k-1}) + f(v_k;\mu_0^b,\sigma_0^b)A_0(v_k)] \quad \text{Equation 14}$$

$$\underline{h}_{k1} = \frac{1}{(\sigma_1^b)^2}[f(v_{k-1};\mu_1^b,\sigma_1^b)A_1(v_{k-1}) + f(v_k;\mu_1^b,\sigma_1^b)A_1(v_k)]$$

$$\underline{h}_{k2} = \frac{1}{\sigma_0^b}[f(v_{k-1};\mu_0^b,\sigma_0^b)B_0(v_{k-1}) + f(v_k;\mu_0^b,\sigma_0^b)B_0(v_k)]$$

$$\underline{h}_{k3} = \frac{1}{\sigma_1^b}[f(v_{k-1};\mu_1^b,\sigma_1^b)B_1(v_{k-1}) + f(v_k;\mu_1^b,\sigma_1^b)B_1(v_k)]$$

It is noted that the vector $\underline{b}$ in Equation 13 the matrix H in Equation 14 depend solely on the base parametric model.

The distribution function of the vector $\underline{e}$ in Equation 12 can be modeled as a multivariate Gaussian distribution having zero mean and a diagonal covariance matrix $C_{ee}$ whose $k^{th}$ diagonal element is given by:

$$C_{ee}[k,k] = \frac{4}{N\Delta v^2}[P_{k,0}^b(1-P_{k,0}^b) + P_{k,1}^b(1-P_{k,1}^b)] \quad \text{Equation 15}$$

wherein the probabilities $P_{k,i}^b$ are given by:

$$P_{k,i}^b = \frac{1}{2}\left[Q\left(\frac{(v_{k-1}-\mu_i^b)}{\sigma_i^b}\right) - Q\left(\frac{(v_k-\mu_i^b)}{\sigma_i^b}\right)\right] \quad \text{Equation 16}$$

The deviation vector $\Delta\underline{P}$ in Equation 12 can be estimated optimally (e.g., under a Least-Squares criterion) as $\Delta\hat{\underline{P}} = G \cdot (\underline{c}-\underline{b})$, with vector $\underline{b}$ given in Equation 13, and matrix G given by:

$$G = (H^H C_{ee}^{-1} H)^{-1} H^H C_{ee}^{-1} \quad \text{Equation 17:}$$

In some embodiments, given a base model $(\mu_i^b, \sigma_i^b)$, the memory controller calculates related auxiliary information by calculating auxiliary vector $\underline{b}$ using Equation 13, and auxiliary matrix G using Equation 17.

In some embodiments, for reducing computational complexity, the covariance matrix $C_{ee}$ may be approximated by an identity matrix. In such embodiments, the memory controller calculates the auxiliary matrix G as given by:

$$G=(H^H H)^{-1} H^H \qquad \text{Equation 18:}$$

Appendix-2: Correcting Confidence Levels Based on Parametric Models of Tvds

Consider a vector $\tilde{v}=[-\infty, v_0, \ldots, v_{L-1}, \infty]$ specifying (L+1) zones created by L RTs denoted $v_0, \ldots, v_{L-1}$. For a pair of adjacent distributions having Gaussian distributions $f(v; \mu_i, \sigma_i)$ as given in Equation 6 above, the $LLR_k$ corresponding to the $k^{th}$ zone k=0 . . . L, is given by:

$$LLR_k=\ln(P_{k,0}/P_{k,1})=\ln(P_{k,0})-\ln(P_{k,1}) \qquad \text{Equation 19:}$$

wherein the zone probabilities induced by the underlying TVDs are given for i=0,1 by:

$$P_{k,i}=\int_{v_{k-1}}^{v_k} f(v;\mu_i,\sigma_i)dv \qquad \text{Equation 20:}$$

The probabilities in Equation 20 may be carried out similarly to Equation 11, in an embodiment.

Deviations in mean and STD parameters from corresponding base parameters are denoted $\Delta\mu_i$ and $\Delta\sigma_i$. In the present example, for the sake of simplicity, it is assumed that the STD values of the underlying TVDs do not vary much across WLs, so that the approximation $\Delta\sigma_i=0$ holds. In alternative embodiments, the parametric model may include both mean values and STD values.

Using a first order approximation, the LLRs in Equation 19 can be expressed as given by:

$$\widehat{LLR}_k = LLR_k + COEF_{k,0} \cdot \Delta\mu_0 + COEF_{k,1} \cdot \Delta\mu_1 \qquad \text{Equation 21:}$$

wherein the correction coefficients $COEF_{k,0}$ and $COEF_{k,1}$ are given by:

$$COEF_{k,i} = \frac{\partial LLR_k}{\partial \mu_i} = \frac{\partial \ln(P_{k,0})}{\partial \mu_i} - \frac{\partial \ln(P_{k,1})}{\partial \mu_i} \qquad \text{Equation 22}$$

and the partial derivatives in Equation 22 are given by:

$$\frac{\partial LLR_k}{\partial \mu_0} = -\frac{1}{P_{k,0}}\left[\frac{1}{2}f(v_k;\mu_0,\sigma_0) - \frac{1}{2}f(v_{k-1};\mu_0,\sigma_0)\right] \qquad \text{Equation 23}$$

$$\frac{\partial LLR_k}{\partial \mu_1} = -\frac{1}{P_{k,1}}\left[\frac{1}{2}f(v_k;\mu_1,\sigma_1) - \frac{1}{2}f(v_{k-1};\mu_1,\sigma_1)\right]$$

The embodiments described above are given by way of example, and other suitable embodiments can also be used. For example, although the embodiments described above refer mainly to parametric models of Gaussian TVDs, in other embodiments, TVDs modeled using other suitable parametric models can also be used.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
an interface, configured to communicate with a plurality of memory cells; and
a processor, configured to:
read a group of the memory cells to produce multiple readouts, using multiple Read Thresholds (RTs) positioned between adjacent Programming Voltages (PVs), in accordance with a base parametric model, wherein the multiple readouts comprise bits of code words and confidence levels assigned respectively to the bits of code words;
determine a deviation between the base parametric model and an estimated actual parametric model in response to the multiple readouts; and
correct the confidence levels of the multiple readouts in response to the determined deviation.

2. The memory controller according to claim 1, wherein the base parametric model and the actual parametric model comprise multiple parameters.

3. The memory controller according to claim 1, wherein the processor is configured to count for each of a plurality of voltage zones between adjacent RTs, a number of memory cells for which the multiple readouts fall in the voltage zone, to calculate normalized cell-counts based on the count, and to determine the deviation based on the normalized cell-counts and on auxiliary information.

4. The memory controller according to claim 3, wherein the auxiliary information comprises an auxiliary vector and an auxiliary matrix, and wherein the processor is configured to determine the deviation by (i) calculating a difference vector between the normalized cell-counts and respective elements in the auxiliary vector, and (ii) multiplying between the auxiliary matrix and the difference vector.

5. The memory controller according to claim 4, wherein the processor is configured to produce based on the auxiliary matrix, a sequence of updated auxiliary matrices over multiple iterations, and to determine the deviation using an updated auxiliary matrix.

6. The memory controller according to claim 1, wherein the processor is configured to evaluate a criterion for updating the base parametric model, and to produce an updated base parametric model in response to meeting the criterion.

7. The memory controller according to claim 1, wherein the processor is configured to read one or more other groups of the memory cells using the actual parametric model.

8. The memory controller according to claim 1, wherein the processor is configured to hold separate base confidence levels for multiple respective subsets of the memory cells in the group, the subsets correspond to different threshold voltages of neighbor memory cells, to derive from the base confidence levels of the subsets corrected confidence levels, based on one or more actual parametric models, and to perform soft decoding to a given code word read from the group of the memory cells using the corrected confidence levels.

9. The memory controller according to claim 8, wherein the processor is configured to calculate for the subsets separate respective actual parametric models, and to derive the corrected confidence levels in a given subset based on the actual parametric model associated with the given subset.

10. The memory controller according to claim 1, wherein the processor is configured to soft decode the code words from the bits, using the corrected confidence levels.

11. The memory controller according to claim 1, wherein the processor is configured to count a number of the group of the memory cells in each of a plurality of voltage zones, and to determine the deviation in response to the count of the number of the group of the memory cells in each of a plurality of voltage zones.

12. A method for data storage, comprising:
in a memory controller that communicates with a plurality of memory cells, reading a group of the memory cells to produce multiple readouts, using multiple Read Thresholds (RTs) positioned between adjacent Programming Voltages (PVs) in accordance with a base parametric model, wherein the multiple readouts comprise bits of code words and confidence levels assigned respectively to the bits of code words;
determining a deviation between the base parametric model and an estimated actual parametric model in to the multiple readouts; and
correcting the confidence levels of the multiple readouts in response to the determined deviation.

13. The method according to claim 12, wherein the base parametric model and the actual parametric model comprise multiple parameters.

14. The method according to claim 12, wherein determining the deviation comprises calculating, based on the multiple readouts, normalized cell-counts of memory cells in the group having readouts that fall in respective zones defined between adjacent RTs, and determining the deviation based on the normalized cell-counts and on auxiliary information.

15. The method according to claim 14, wherein the auxiliary information comprises an auxiliary vector and an auxiliary matrix, and wherein determining the deviation comprises (i) calculating a difference vector between the normalized cell-counts and respective elements in the auxiliary vector, and (ii) multiplying between the auxiliary matrix and the difference vector.

16. The method according to claim 15, and comprising producing based on the auxiliary matrix, a sequence of updated auxiliary matrices over multiple iterations, and determining the deviation using an updated auxiliary matrix.

17. The method according to claim 12, and comprising evaluating a criterion for updating the base parametric model, and producing an updated base parametric model in response to meeting the criterion.

18. The method according to claim 12, and comprising reading one or more other groups of the memory cells using the actual parametric model.

19. The method according to claim 12, and comprising holding separate base confidence levels for multiple respective subsets of the memory cells in the group, the subsets correspond to different threshold voltages of neighbor memory cells, deriving from the base confidence levels of the subsets corrected confidence levels, based on one or more actual parametric models, and performing soft decoding to a given code word read from the group of the memory cells using the corrected confidence levels.

20. The method according to claim 19, and comprising calculating for the subsets separate respective actual parametric models, and deriving the corrected confidence levels in a given subset based on the actual parametric model associated with the given subset.

* * * * *